(12) United States Patent
Gardner et al.

(10) Patent No.: US 6,752,162 B1
(45) Date of Patent: Jun. 22, 2004

(54) EDGE ROLLER ASSEMBLY, METHOD FOR CONTACTING AN EDGE OF A SUBSTRATE, AND TRANSPORT SYSTEM FOR TRANSPORTING SEMICONDUCTOR WAFERS TO A WAFER PROCESSING STATION

(75) Inventors: Douglas G. Gardner, Milpitas, CA (US); Stephen Mark Smith, Morgan Hill, CA (US); Brian M. Bliven, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 340 days.

(21) Appl. No.: 09/687,747

(22) Filed: Oct. 13, 2000

Related U.S. Application Data

(63) Continuation-in-part of application No. 09/608,515, filed on Jun. 30, 2000.

(51) Int. Cl.[7] .............................. B08B 7/00; B65G 47/24
(52) U.S. Cl. ....................... 134/157; 134/153; 134/902; 198/394; 198/782
(58) Field of Search ........................... 134/6, 902, 153, 134/157; 15/88.3, 97.1, 102, 88.1, 82.2, 77; 492/27, 30, 39; 414/433, 757; 198/394, 782; 192/394

(56) References Cited

U.S. PATENT DOCUMENTS

| 4,217,977 A | | 8/1980 | Tam |
| 4,313,266 A | | 2/1982 | Tam |
| 5,839,460 A | * | 11/1998 | Chai et al. ................... 134/147 |
| 5,840,129 A | * | 11/1998 | Saenz et al. ................... 134/2 |
| 5,862,560 A | * | 1/1999 | Jensen et al. ................... 15/77 |
| 5,924,154 A | | 7/1999 | Gockel et al. |
| 6,021,791 A | | 2/2000 | Dryer et al. |
| 6,439,245 B1 | * | 8/2002 | Bliven et al. .................. 134/32 |

FOREIGN PATENT DOCUMENTS

| EP | 1058296 A2 | * 12/2000 | ........... H01L/21/00 |
| WO | WO 99/04416 | 1/1999 | |

* cited by examiner

Primary Examiner—Alexander Markoff
(74) Attorney, Agent, or Firm—Martine & Penilla, LLP

(57) ABSTRACT

An edge roller assembly includes first and second grip rings. The grip rings are held together in an opposing relationship such that outer surfaces thereof define a groove for receiving an edge of a substrate. The grip rings may be O-rings formed of a rubber material. In one embodiment, the grip rings are held together by lower and upper clamp plates that are adjustably fastened together so that the clamping forces exerted on the substrate can be controlled. The upper clamp plate may have a height adjustment knob for adjusting the height of the edge roller assembly mounted thereon. A method for contacting an edge of a substrate and a transport system for transporting semiconductor wafers to a wafer processing station also are described.

14 Claims, 12 Drawing Sheets

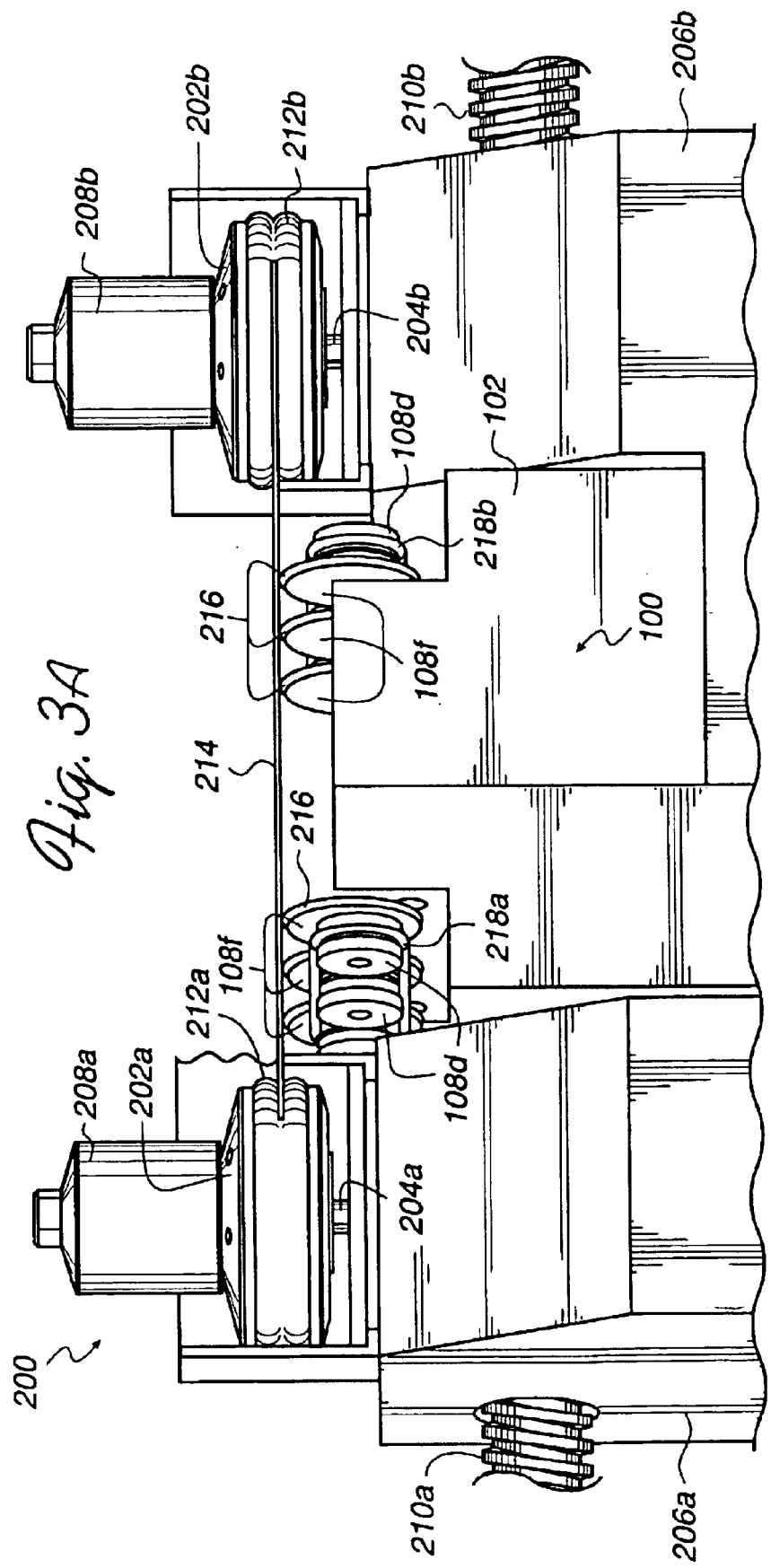

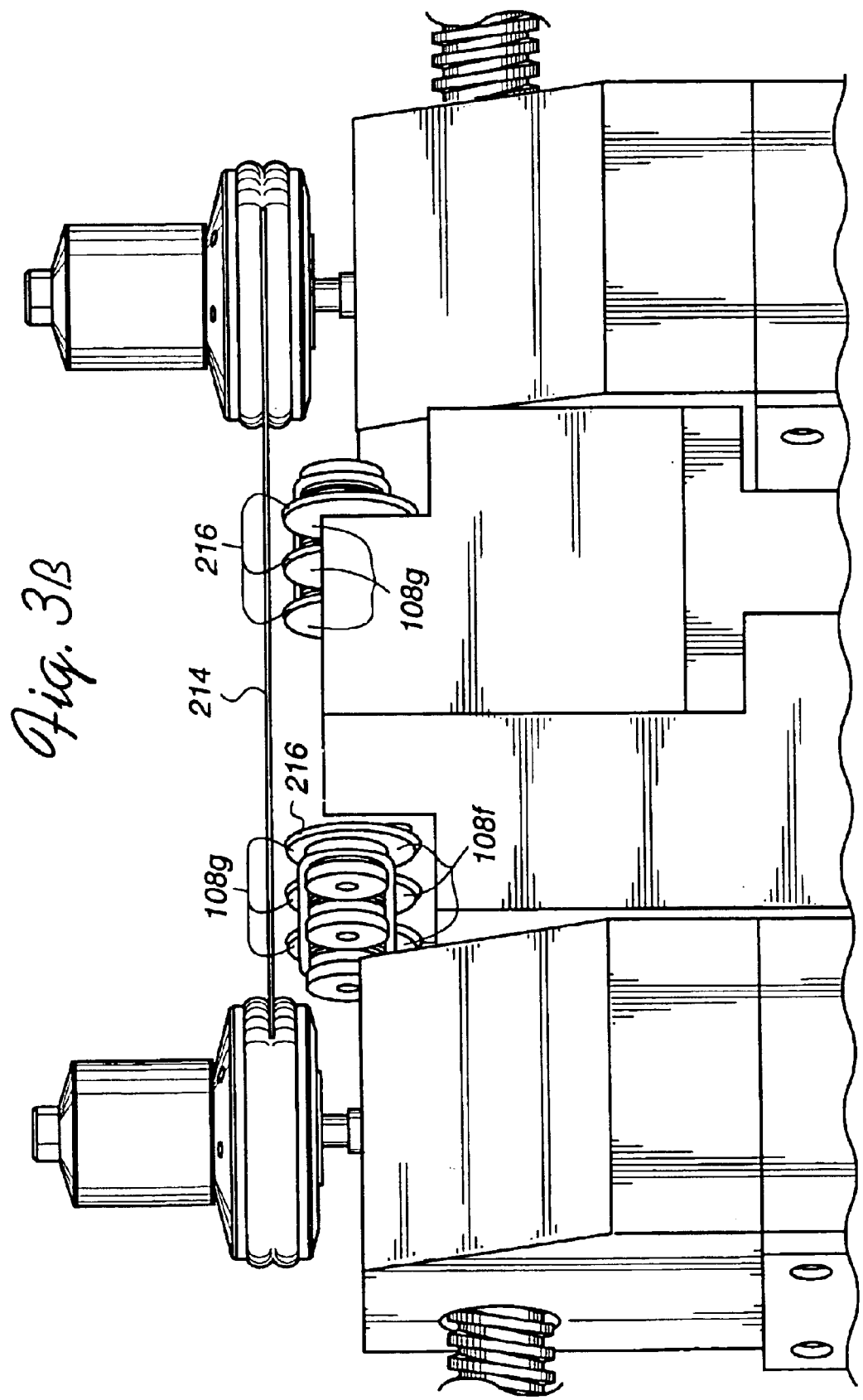

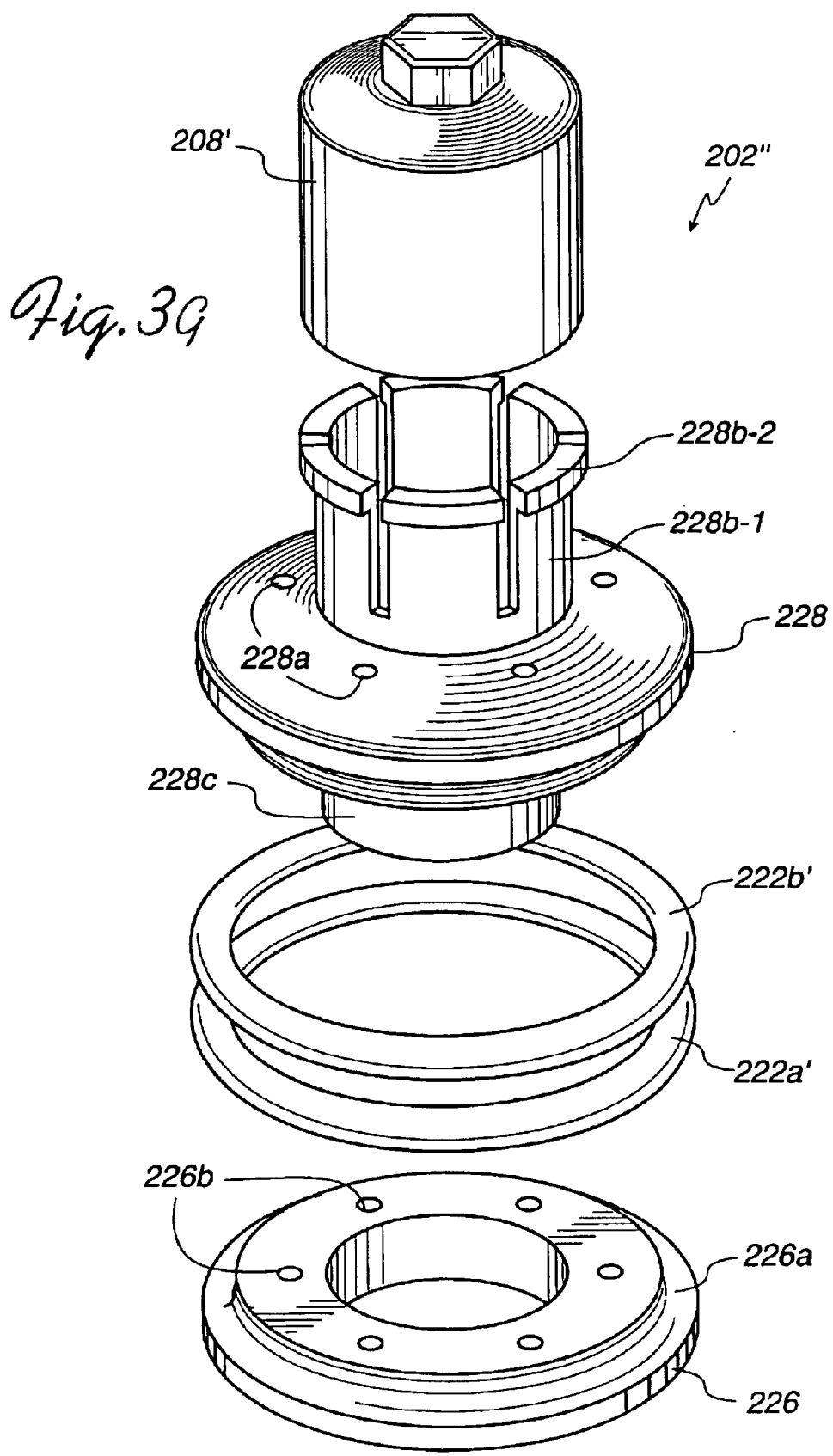

EDGE ROLLER ASSEMBLY, METHOD FOR CONTACTING AN EDGE OF A SUBSTRATE, AND TRANSPORT SYSTEM FOR TRANSPORTING SEMICONDUCTOR WAFERS TO A WAFER PROCESSING STATION

CROSS-REFERENCE TO RELATED APPLICATIONS

This application is a continuation-in-part of Application Ser. No. 09/608,515, filed on Jun. 30, 2000. The disclosure of this application is incorporated herein by reference.

BACKGROUND OF THE INVENTION

The present invention relates generally to semiconductor fabrication and, more particularly, to an edge roller assembly, a method for contacting an edge of a substrate, and a transport system for transporting semiconductor wafers to a wafer processing station.

In the fabrication of semiconductor devices, a variety of wafer preparation operations are performed. FIG. 1 is a schematic diagram of a conventional wafer cleaning system 50. The cleaning system 50 includes a load station 10 where a plurality of wafers in a cassette 14 may be inserted into the system for cleaning. Once the wafers are inserted into the load station 10, a wafer 12 may be taken from the cassette 14 and moved into a brush station 16, which includes a first brush box 16a and a second brush box 16b. The wafer 12 is first moved into first brush box 16a, where the wafer is scrubbed in a solution containing specified chemicals and deionized (DI) water. The wafer 12 is then moved into second brush box 16b, where the wafer is again scrubbed in a solution containing specified chemicals and DI water. After the wafer 12 has been scrubbed in brush boxes 16a and 16b, the wafer is moved into a spin, rinse, and dry (SRD) station 20 where DI water is sprayed onto the top and bottom surfaces of the wafer as the wafer is spun. After the wafer 12 has been dried, the wafer is moved from SRD station 20 to an unload station 22.

To achieve the best throughput productivity in wafer cleaning system 50, wafer 12 must be rapidly and efficiently transported from first brush box 16a to second brush box 16b. In comparison with a conveyor system, a robotic "pick and place" system is a slow and inefficient way to transport a wafer from the first brush box to the second brush box. Conventional conveyor systems, however, suffer from the drawback that they are capable of transporting wafers only in a horizontal plane. Consequently, these conveyor systems do not interface efficiently with the equipment, e.g., edge clamp devices, that handles a wafer during processing because either the wafer or the track must be moved to obtain the clearance required to process the wafer.

Another problem associated with transporting wafers involves the edge clamp devices. One conventional edge clamp device is a one-piece, custom molded roller wheel. This conventional edge clamp device suffers from two primary disadvantages. First, the molded roller wheel is not reliable because the complicated pattern formed therein causes the wheel to fail prematurely. Second, the molded roller wheel is relatively expensive to manufacture and requires a long lead time.

In view of the foregoing, there is a need for a device that efficiently transports a wafer through a wafer processing station such as, for example, a wafer cleaning system having a first brush box and a second brush box. There also is a need for a reliable and cost effective edge clamp device for use in transporting wafers to a wafer processing station.

SUMMARY OF THE INVENTION

Broadly speaking, the present invention fills this need by providing an edge roller assembly that reliably grips the edge of a substrate and is simple and cost effective to manufacture. The present invention also provides a method for contacting an edge of a substrate and a transport system for transporting wafers to a wafer processing station.

In accordance with one aspect of the present invention, an edge roller assembly is provided. The edge roller assembly includes a first grip ring and a second grip ring. The first and second grip rings are held together in an opposing relationship such that outer surfaces thereof define a groove for receiving an edge of a substrate, e.g., a wafer.

In one embodiment, the first and second grip rings are O-rings comprised of a rubber material. The rubber material preferably has a Shore A hardness in a range from about 40 to about 90. Representative rubber materials include VITON rubber, polyurethane rubber, EPDM rubber, and fluoropolymer rubber.

In one embodiment, the edge roller assembly includes a lower clamp plate and an upper clamp plate. In this embodiment, the first and second grip rings are disposed between the lower and upper clamp plates in an opposing relationship such that outer surfaces thereof define a groove for receiving an edge of a substrate. The lower and upper clamp plates may be adjustably fastened together so that the clamping forces the lower and upper clamp plates exert on the first and second grip rings can be controlled.

In one embodiment, the lower clamp plate is in the form of a ring having a surface for receiving the first grip ring and a plurality of holes configured to receive a screw head. In one embodiment, the upper clamp plate includes a surface for receiving the second grip ring, a central throughhole for receiving a drive shaft, a plurality of threaded holes, and a plurality of fingers extending from an upper surface thereof. In one embodiment, the edge roller assembly may include a height adjustment knob rotatably disposed on the fingers extending from the upper surface of the upper clamp plate. The height adjustment knob may have a threaded hole formed therein for receiving a threaded portion of the drive shaft. In one embodiment, the lower clamp plate, the upper clamp plate, and the height adjustment knob are formed of polyethylene terephthalate.

In accordance with another aspect of the present invention, a method for contacting an edge of a substrate is provided. In this method a pair of grip rings are clamped together in an opposing relationship such that outer surfaces thereof define a groove. An edge of a substrate, e.g., a wafer, is then inserted into the groove. In one embodiment, the pair of grip rings is clamped together with a controlled force. In one embodiment, the grip rings are O-rings.

In accordance with yet another aspect of the present invention, a transport system for transporting semiconductor wafers to a wafer processing station is provided. This transport system includes a pair of edge roller assemblies disposed in an opposing relationship. Each of the pair of edge roller assemblies includes first and second grip rings, which may be in the form of O-rings, held together in an opposing relationship such that outer surfaces thereof define a groove for receiving an edge of a wafer. In addition, each of the pair of edge roller assemblies is disposed on a rotatable drive shaft. The transport system is well suited to transport wafers to wafer processing stations at which wafer cleaning operations and wafer buffing operations are performed.

The edge roller assembly of the present invention provides a number of significant advantages. First, the edge roller assembly is simple and cost effective to manufacture because it does not require custom molded parts. Second, the configuration of the edge roller assembly enables the clamping forces exerted on the substrate to be controlled. Third, the grip rings are not subject to premature failure because they do not have any complex patterns formed therein. Fourth, the groove for receiving the edge of the substrate defined by the grip rings provides natural centering action. And fifth, the grip rings can be easily changed, which facilitates the use of diverse substrate contact materials to meet the demands of different applications.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 3A is a simplified elevational view of a wafer processing station including a conveyor system in accordance with one embodiment of the invention.

FIG. 3B is a simplified elevational view of the wafer processing station shown in FIG. 3A after the conveyor system has been moved clear of the wafer for processing in accordance with one embodiment of the invention.

FIG. 3G is an exploded view of the edge roller assembly shown in FIG. 3F.

DETAILED DESCRIPTION OF THE INVENTION

Figure 1:
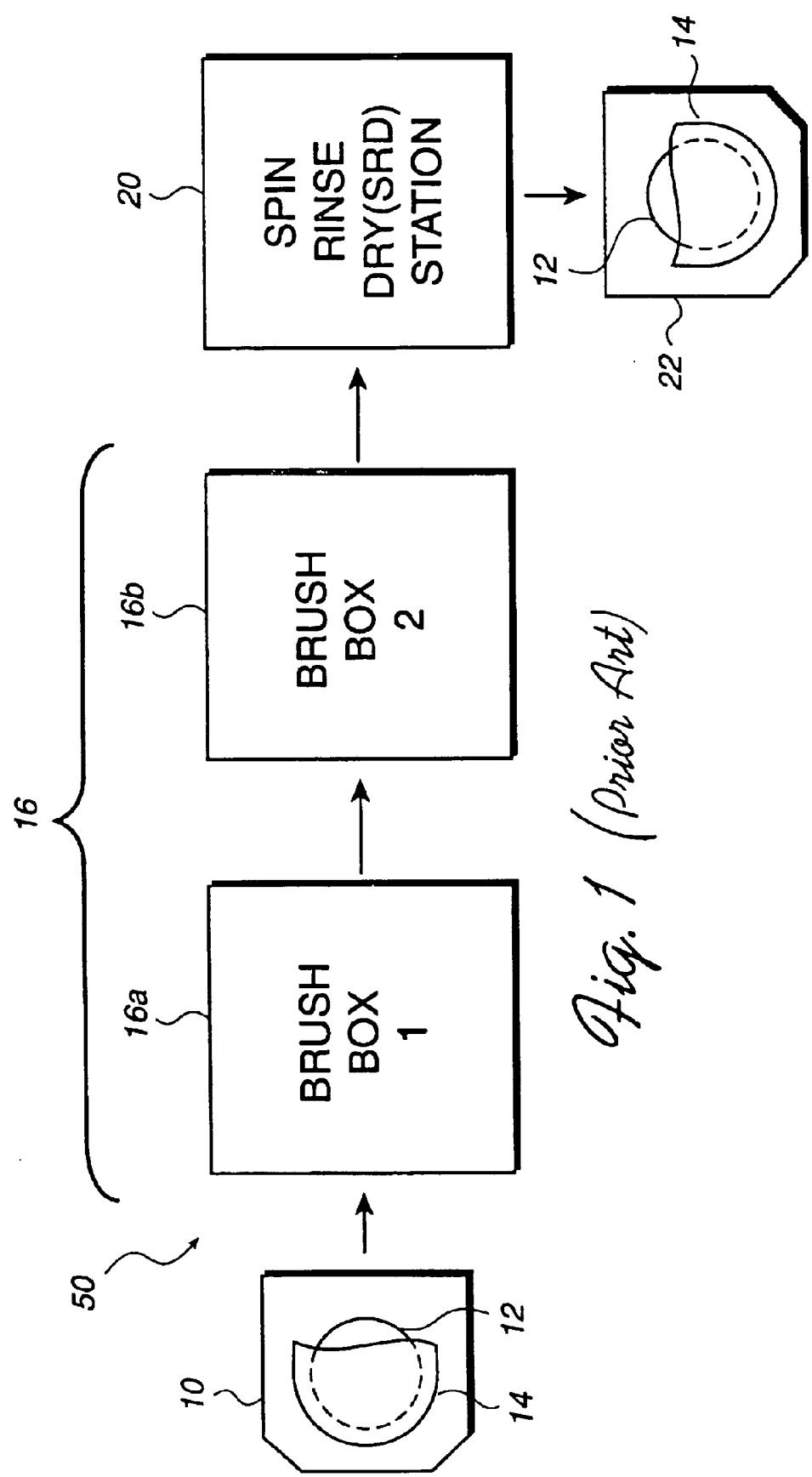
FIG. 1 is a schematic diagram of a conventional wafer cleaning system.

Several exemplary embodiments of the invention will now be described in detail with reference to the accompanying drawings. FIG. 1 is discussed above in the "Background of the Invention" section.

Figure 2A:
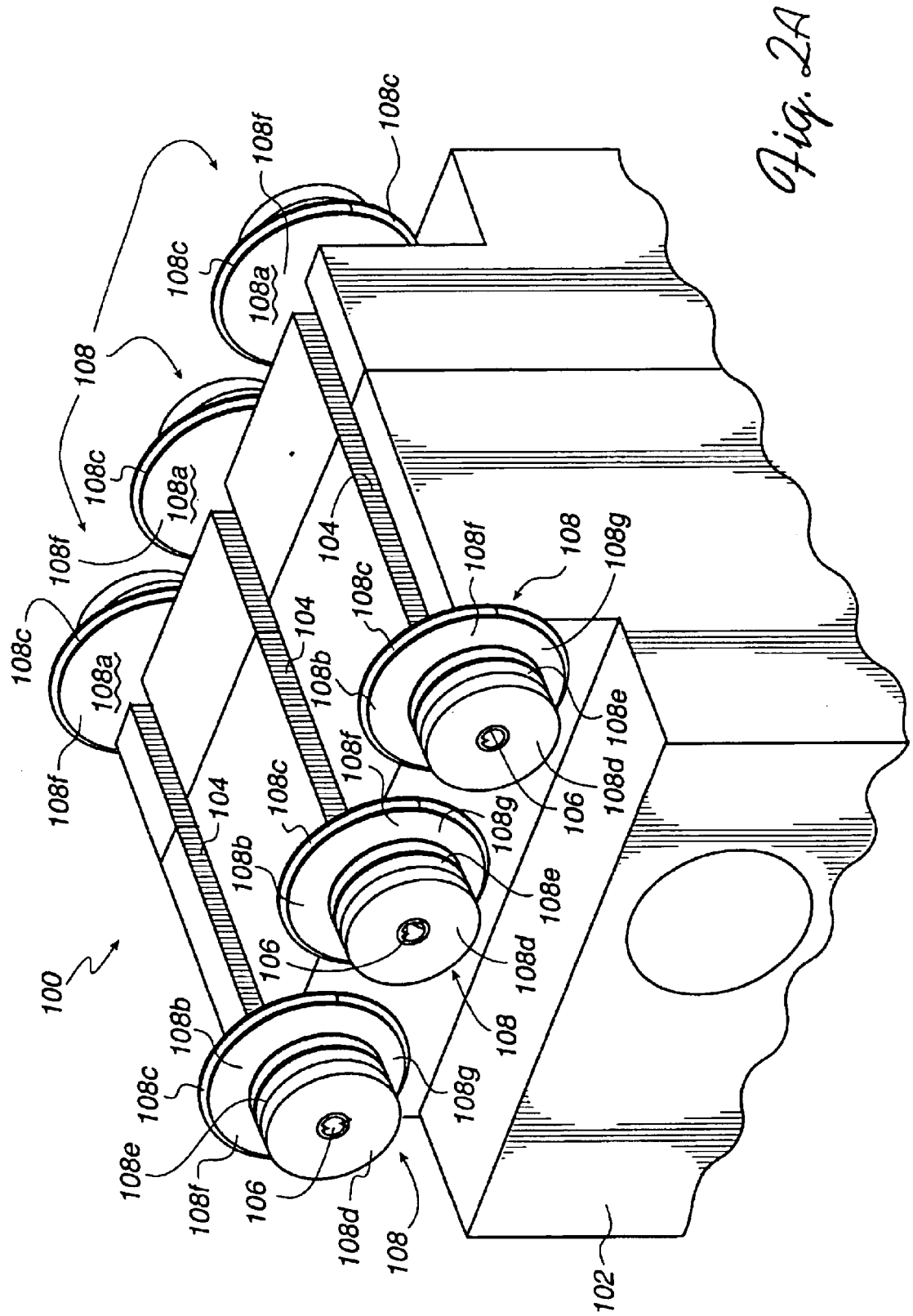
FIG. 2A is a simplified perspective view of a conveyor system with dual radius wheels in the "wheels up" position in accordance with one embodiment of the invention.

FIG. 2A is a simplified perspective view of conveyor system 100 in accordance with one embodiment of the invention. As shown therein, conveyor system 100 includes support stand 102 that has grooves 104 formed in a top surface thereof. Axles 106, which have dual radius wheels 108 mounted on the ends thereof, are disposed in grooves 104. Each of dual radius wheels 108 has inner surface 108a, outer surface 108b, and edge surface 108c, which extends between inner surface 108a and outer surface 108b and is configured to receive an O-ring for contacting a semiconductor wafer, as explained in more detail below. Hub 108d, which has groove 108e formed therein, is provided on outer surface 108b. Groove 108e is configured to receive a timing belt for rotating dual radius wheels 108 in unison.

Figure 2B:
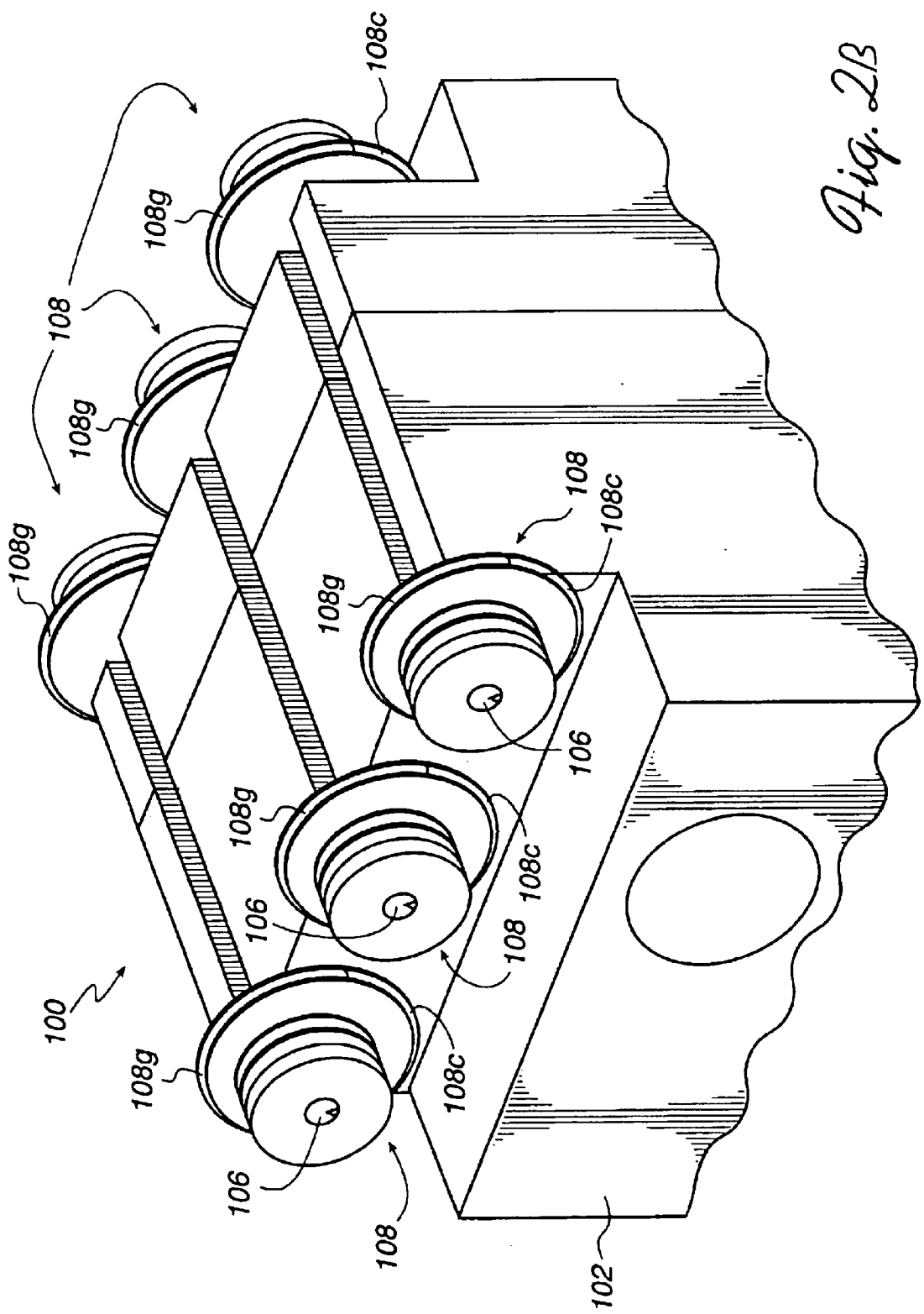
FIG. 2B is a simplified perspective view of the conveyor system shown in FIG. 2A after the dual radius wheels have been rotated so that they are in the "wheels down" position in accordance with one embodiment of the invention.

Each of dual radius wheels 108 has first semicircular section 108f for supporting a wafer at a first level and second semicircular section 108g for supporting the wafer at a second level, which is lower than the first level. As shown in FIG. 2A, dual radius wheels 108 are in the "wheels up" position in which first semicircular sections 108f face in an upward direction. In this position, first semicircular sections 108f support the wafer at a first level for processing, as described in more detail below. FIG. 2B is a simplified perspective view of conveyor system 100 shown in FIG. 2A after dual radius wheels 108 have been rotated so that they are in the "wheels down" position. As shown in FIG. 2B, second semicircular sections 108g face in an upward direction. In this position, second semicircular sections 108g may either support the wafer or provide clearance between the wafer and dual radius wheels 108 during processing, as will be described in more detail later.

Figure 2C:
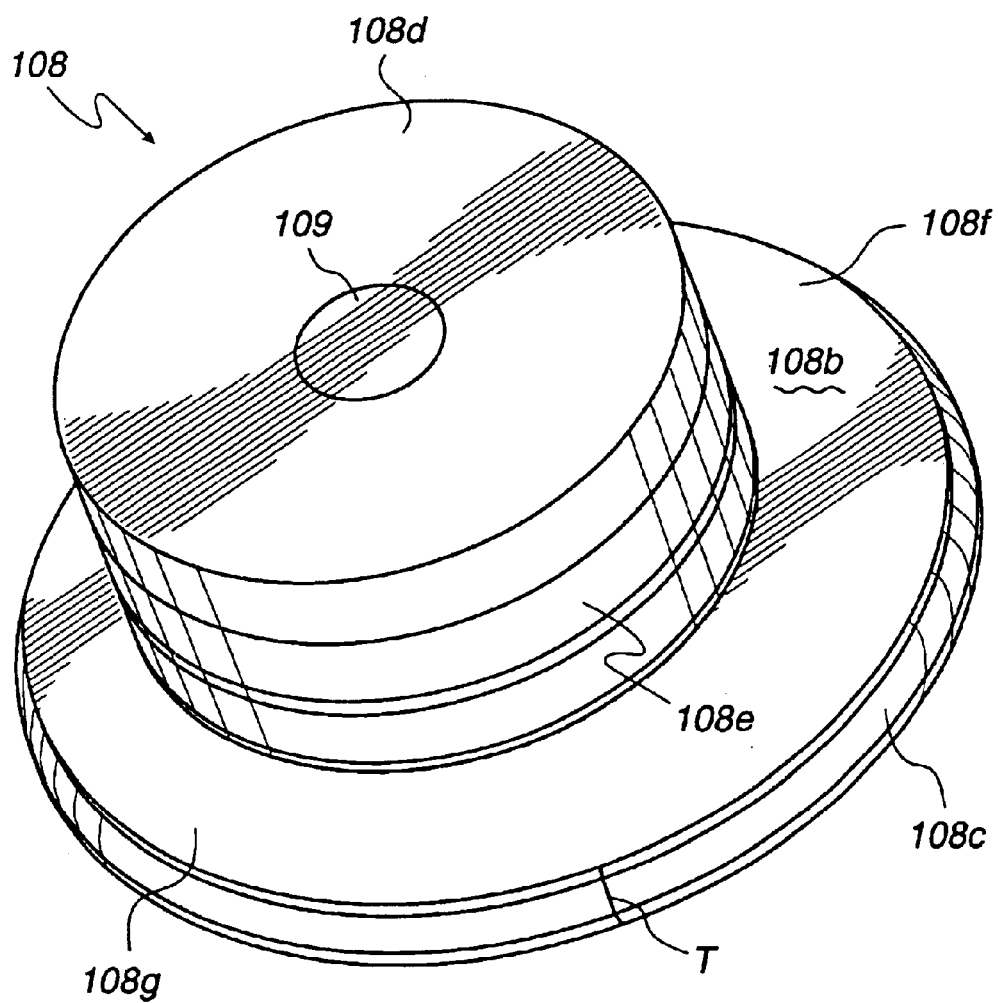
FIG. 2C is an enlarged perspective view of a dual radius wheel in accordance with one embodiment of the invention.

FIG. 2C is an enlarged perspective view of a dual radius wheel in accordance with one embodiment of the invention. As shown in FIG. 2C, dual radius wheel 108 includes hub 108d provided on outer surface 108b. Hub 108d has groove 108e formed therein for receiving a timing belt, as described above. Edge surface 108c extends between outer surface 108b and inner surface 108a (see FIGS. 2A and 2B) and defines a groove for receiving an O-ring that contacts the wafer. Central aperture 109 extends through dual radius wheel 108 and is configured to receive an axle. The transition between first semicircular section 108f and second semicircular section 108g occurs at points T (only one of which is visible in FIG. 2C). In one embodiment, each of first semicircular section 108f and second semicircular section 108g defines an arc that spans about 180 degrees. Dual radius wheel 108, as well as the other components of the conveyor system, may be formed of well-known materials that are suitable for use in a semiconductor processing environment in which cleaning chemicals are used.

FIG. 3A is a simplified elevational view of a wafer processing station including a conveyor system in accordance with one embodiment of the invention. As shown therein, wafer processing station 200 includes edge roller assemblies 202a and 202b, which are mounted on shafts 204a and 204b, respectively. Shafts 204a and 204b extend into gear housings 206a and 206b, respectively, which enclose the drive mechanisms for rotating edge roller assemblies 202a and 202b. Height adjustment knobs 208a and 208b for adjusting the height of edge roller assemblies 202a and 202b, respectively, are provided on shafts 204a and 204b, respectively. Lead screws 210a and 210b provide lateral movement of gear housings 206a and 206b, respectively, so that the lateral position of edge roller assemblies 202a and 202b can be adjusted. Edge clamp devices 212a and 212b for clamping the edge of semiconductor wafer 214 are disposed on edge roller assemblies 202a and 202b, respectively. Additional details of two exemplary edge clamp devices are described below with reference to FIGS. 3D and 3E. Additional details of an exemplary edge roller assembly are described below with reference to FIGS. 3F–3I.

As shown in FIG. 3A, first semicircular sections 108f of dual radius wheels 108 (see, e.g., FIGS. 2A and 2B) of conveyor system 100 support wafer 214 at the level at which the wafer will be processed in wafer processing station 200. More particularly, O-rings 216, which are disposed in edge surface 108c (see, e.g., FIG. 2C) of each dual radius wheel 108, contact the backside of wafer 214 and thereby support the wafer. As shown in FIG. 3A, conveyor system 100 includes three pairs of dual radius wheels 108, with each pair of wheels being arranged in an opposing relationship on opposite sides of support stand 102. Timing belt 218a rotates the set of dual radius wheels 108 situated on the left side of support stand 102 and timing belt 218b rotates the set of wheels situated on the right side of the support stand. Timing belts 218a and 218b are disposed in grooves 108e formed in hubs 108d, as shown, for example, in FIG. 2A.

FIG. 3B is a simplified elevational view of wafer processing station 200 shown in FIG. 3A after conveyor system 100 has been moved clear of wafer 214 for processing in accordance with one embodiment of the invention. As shown in FIG. 3B, dual radius wheels 108 have been rotated so that second semicircular sections 108g face in an upward direction toward the backside of wafer 214. Second semicircular section 108g is configured to provide sufficient clearance for safely processing wafer 214. Consequently, when second semicircular sections 108g are positioned as shown in FIG. 3B, a gap is defined between the outer surfaces of O-rings 216 disposed on dual radius wheels 108 and the backside of wafer 214. In one embodiment, second semicircular section 108g is configured such that the gap, i.e., the distance between the outer surfaces of O-rings 216 and the backside of wafer 214, is in the range from about one sixteenth (1/16) of an inch to about three sixteenths (3/16) of an inch, with the range from about one eighth (1/8) of an inch to about three sixteenths (3/16) of an inch being preferred. The configuration of second semicircular section 108g is discussed in more detail below with reference to FIGS. 4A and 4B.

It will be apparent to those skilled in the art that the center-to-center spacing of dual radius wheels 108 of conveyor system 100 must be selected to ensure that wafer 214 is adequately supported as the wafer advances along the conveyor system. Generally speaking, for 8-inch wafers, the center-to-center spacing should not exceed about 3.6 inches. For 12-inch wafers, the center-to-center spacing should not exceed about 5.5 inches.

Figure 3C:
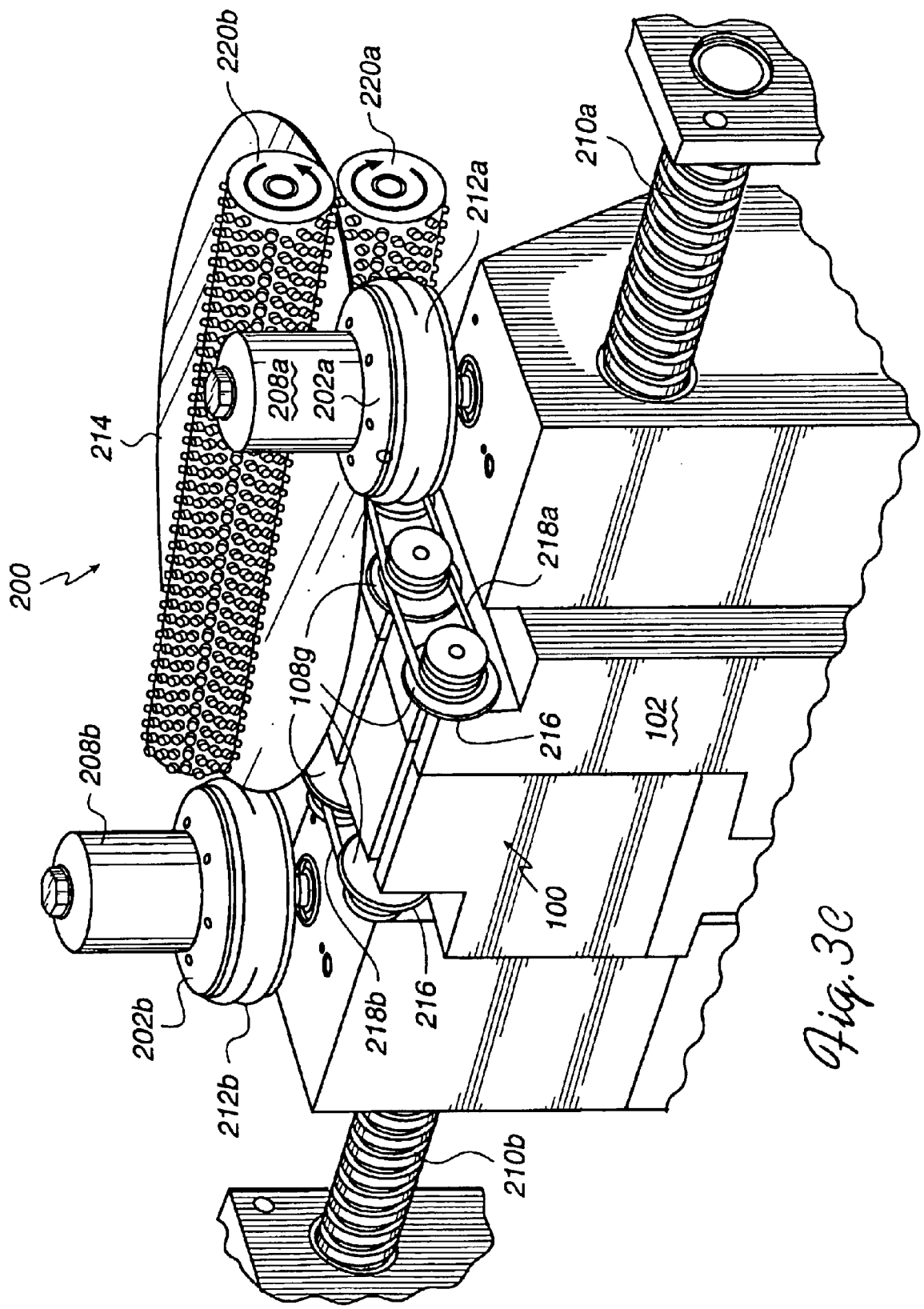
FIG. 3C is a simplified elevational view of the wafer processing station shown in FIG. 3B as the wafer is being subjected to a wafer cleaning operation in accordance with one embodiment of the invention.

FIG. 3C is a simplified elevational view of wafer processing station 200 shown in FIG. 3B as wafer 214 is being subjected to a wafer cleaning operation in accordance with one embodiment of the invention. As shown in FIG. 3C, wafer processing station 200 is a brush box in which wafer 214 is being cleaned by rotating brushes 220a and 220b. The arrows in FIG. 3C indicate the respective directions in which lower brush 220a and upper brush 220b rotate during cleaning. With dual radius wheels 108 of conveyor system 100 rotated out of contact with wafer 214 as described above in connection with FIG. 3B, the wafer is otherwise supported in the process plane for the cleaning operation. In particular, edge clamp devices 212a and 212b, which are disposed on edge roller assemblies 202a and 202b, respectively, and lower brush 220a support wafer 214 in the process plane for cleaning.

Figure 3D:
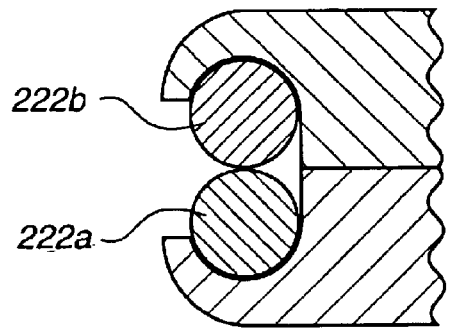
FIGS. 3D and 3E show simplified cross-sectional views of two exemplary edge clamp devices that may be used to clamp the edge of the wafer.
Figure 3E:
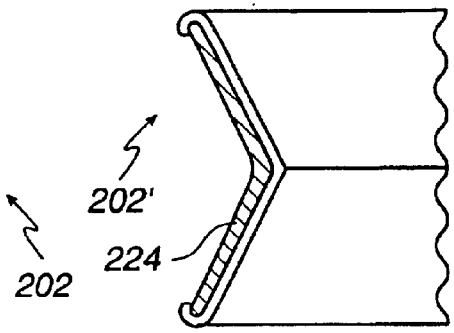

FIGS. 3D and 3E show simplified cross-sectional views of two exemplary edge clamp devices that may be used to clamp the edge of the wafer. FIG. 3D shows a double O-ring edge clamp device including O-rings 222a and 222b disposed around edge roller assembly 202. FIG. 3E shows a polyurethane pad edge clamp device in which polyurethane pad 224 is supported in a V-shaped groove defined in edge roller assembly 202'.

Figure 3F:
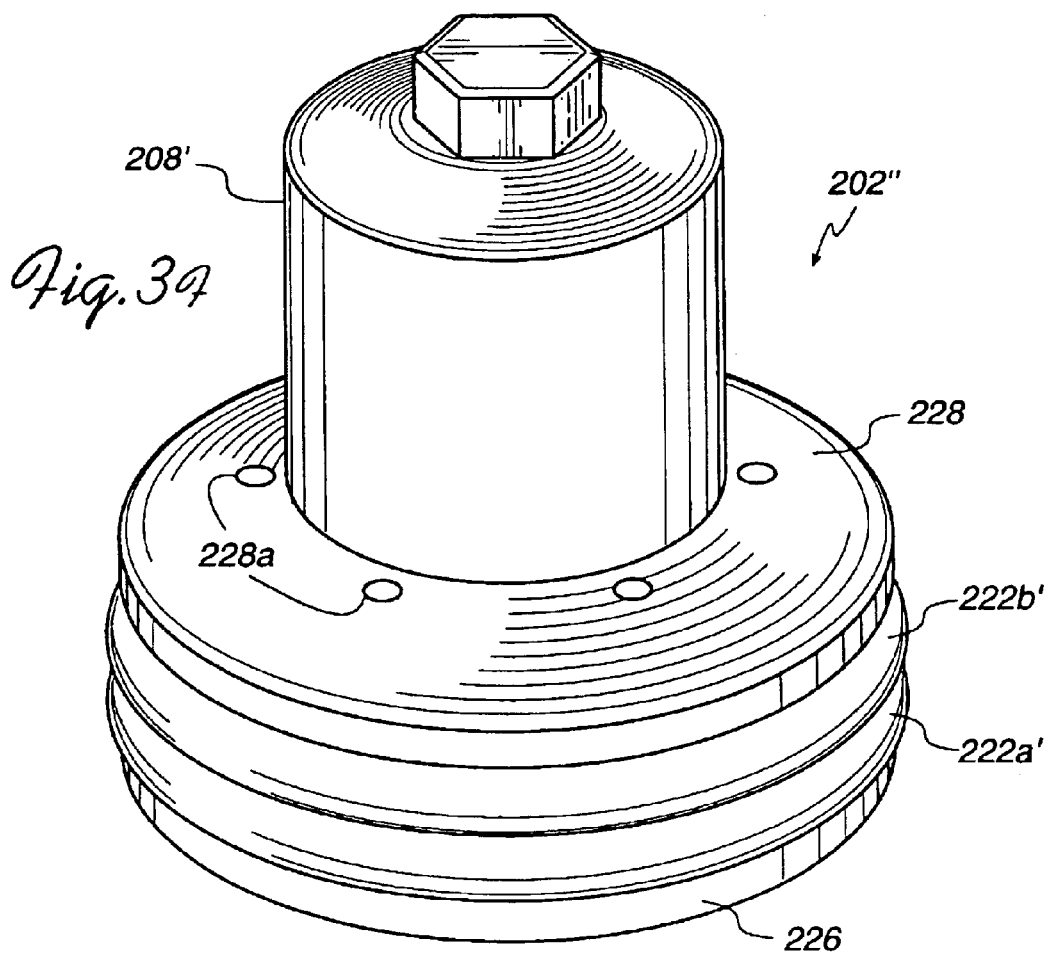
FIG. 3F is a perspective view of an exemplary edge roller assembly in accordance with one embodiment of the invention.

FIGS. 3F–3I show the details of an exemplary edge roller assembly including two grip rings in accordance with one embodiment of the invention. FIG. 3F is a perspective view of this exemplary edge roller assembly. As shown in FIG. 3F, edge roller assembly 202" includes grip rings 222a' and 222b', which are held in an opposing relationship by lower clamp plate 226 and upper clamp plate 228. In one embodiment, grip rings 222a' and 222b' are O-rings. A plurality of holes 228a, the purpose of which will be explained later, are formed in upper clamp plate 228. Height adjustment knob 208' is mounted on upper clamp plate 228 in the manner explained below with reference to FIG. 3H.

FIG. 3G is an exploded view of edge roller assembly 202" shown in FIG. 3F. As shown in FIG. 3G, lower clamp plate 226 is in the form of a ring having a surface 226a for receiving grip ring 222a'. A plurality of holes 226b, the purpose of which will be explained later, are formed in lower clamp plate 226. Upper clamp plate 228 includes a plurality of fingers 228b-1 that extend upwardly from an upper surface of the upper clamp plate. Each finger 228b-1 has flange 228b-2 at the top end thereof so that height adjustment knob 208' can be snapped onto the fingers, as explained in more detail below with reference to FIG. 3H. As shown in FIG. 3G, fingers 228b-1 form part of a cylinder. This configuration allows height adjustment knob 208' to rotate around fingers 228b-1. Upper clamp plate 228 also includes cylindrical portion 228c that is configured to nest in the central opening of lower clamp plate 226, as shown in FIG. 3H.

Figure 3H:
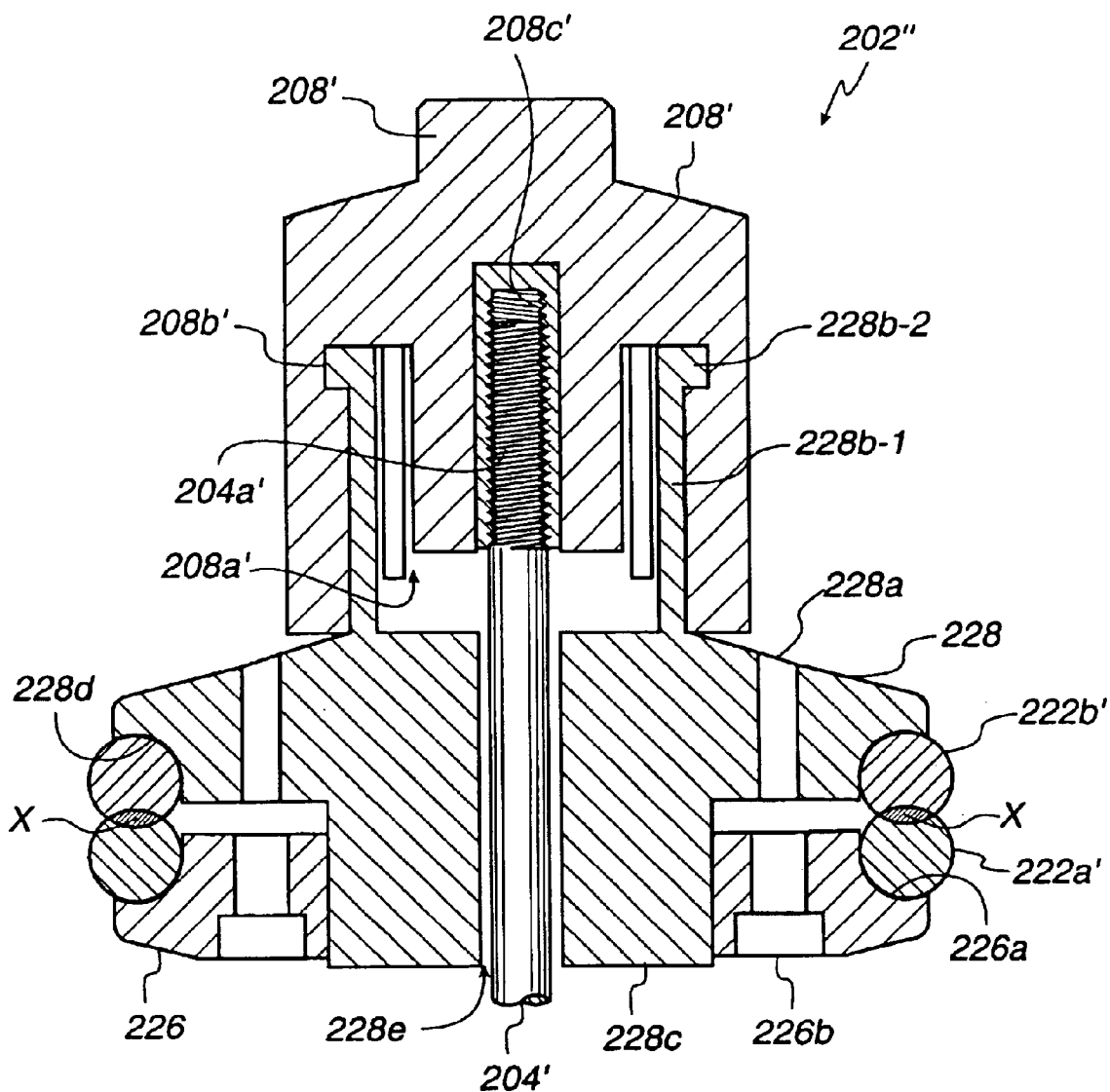
FIG. 3H is a cross-sectional view of the edge roller assembly shown in FIG. 3F.

FIG. 3H is a cross-sectional view of edge roller assembly 202" shown in FIG. 3F. As shown in FIG. 3H, holes 226b in lower clamp plate 226 are provided with recesses configured to receive a screw head. Grip ring 222a' is seated against surface 226a, which is curved so as to conform to the shape of the grip ring. Holes 228a in upper clamp plate 228 are threaded so that lower clamp plate 226 and upper clamp plate 228 can be fastened together with screws or other equivalent fastener. In one embodiment, the screws fastened in holes 226b and 228a are made of Hastelloy; however, it will be apparent to those skilled in the art that the screws may be formed of other suitable materials. Grip ring 222b' is seated against surface 228d, which is curved so as to conform to the shape of the grip ring. The overlap between grip ring 222a' and grip ring 222b', which is indicated by the darkened Section X in FIG. 3H, represents the clamping force that lower clamp plate 226 and upper clamp plate 228 exert on the grip rings. This clamping force may be controlled by adjusting the torque on the screws that hold lower clamp plate 226 and upper clamp plate 228 together. The torque on the screws may be adjusted with a torque wrench or other suitable tool to provide a desired clamping force.

Height adjustment knob 208' has cylindrical recess 208a' formed therein. Groove 208b' extends around the innermost portion of cylindrical recess 208a'. Height adjustment knob 208' may be mounted on upper clamp plate 228 by pushing the height adjustment knob down over fingers 228b-1 until flanges 228b-2 snap into groove 208b'. When fastened to upper clamp plate 228 in this manner, height adjustment knob 208' can be freely rotated around fingers 228b-1, but cannot be moved either up or down because groove 208b' catches flanges 228b-2 and thereby prevents axial movement of the height adjustment knob. Those skilled in the art will recognize that other equivalent mechanical fastening techniques may be used to fasten the height adjustment knob to the upper clamp plate.

Height adjustment knob 208' also has a central threaded hole 208c' formed therein. Threaded hole 208c' is configured to receive the threaded portion of a drive shaft. As shown in FIG. 3H, threaded portion 204a' of drive shaft 204', which extends through central hole 228e formed in upper clamp plate 228, is received in threaded hole 208c' of height adjustment knob 208'. The height of edge roller assembly 202" may be adjusted by rotating height adjustment knob 208' so that the height adjustment knob moves up or down on threaded portion 204a' of drive shaft 204'. The shape of central hole 228e in upper clamp plate 228 conforms to the shape of the remainder of drive shaft 204' so that rotation of the drive shaft will in turn cause rotation of the upper clamp plate and all components connected thereto. In one embodiment, the remainder of drive shaft 204', i.e., the non-threaded portion of the drive shaft, and central hole 228e have a rectangular shape. Those skilled in the art will recognize that these components may have other suitable shapes, e.g., a hexagonal shape.

Figure 3I:
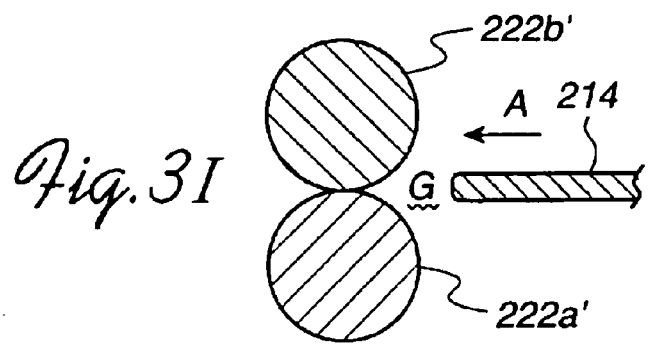
FIG. 3I is a simplified schematic diagram that shows a wafer being inserted into the groove defined by two grip rings in accordance with one embodiment of the invention.

FIG. 3I is a simplified schematic diagram that shows a wafer being inserted into the groove defined by two grip rings in accordance with one embodiment of the invention. As shown in FIG. 3I, wafer 214 may be moved in the direction indicated by arrow A toward groove G defined by outer surfaces of grip rings 222a' and 222b'. The curvatures of the outer surfaces of grip rings 222a' and 222b' naturally guide wafer 214 toward the center of groove G. This natural centering action provides more forgiveness in the centering of wafer 214 between grip rings 222a' and 222b'. If desired, the profile of the grip rings may be varied from the O-ring profile shown in FIG. 3I. By way of example, the grip rings may have a hexagonal profile in the event a more V-shaped groove for receiving the edge of the wafer is desired.

The components of edge roller assembly 202' may be formed of any suitable material that is capable of withstanding the environment in which the edge roller assembly is to be used. In one embodiment, the grip rings are standard, commercially available O-rings made of a rubber material. Representative rubber materials include VITON rubber (a fluoroelastomer based on the copolymer of vinylidene fluoride and hexafluoropropylene, which is commercially available from Du Pont of Wilmington, Del.), polyurethane rubber, EPDM rubber, and high purity fluoropolymer rubbers, e.g., the fluoropolymer rubbers sold under the trade names KALREZ and CHEMRAZ. In one embodiment, the rubber material has a Shore A hardness in the range from about 40 to about 90. In addition to adjusting the torque on the screws that hold the lower and upper clamp plates together, the clamping force exerted on the substrate also may be controlled by varying the hardness of the grip ring material within this range. Those skilled in the art will recognize that one significant advantage of the present invention is that it facilitates the use of diverse substrate contact materials. In the event a different substrate contact material is needed, the grip rings mounted on the edge roller assembly may be easily replaced with grip rings made of the desired material.

In one embodiment, the lower and upper clamp plates and the height adjustment knob are formed of polyethylene terephthalate (PET). This material is desirable for these components because of its structural rigidity, chemical resistance, lack of particle generation, and lack of outgassing. In environments that do not require one or more of these characteristics, other suitable materials, e.g., stainless steel and coated aluminum, may be used to form the clamp plates and the height adjustment knob. In one embodiment designed to transport 300 mm wafers, the diameter of the edge roller assembly is about 2 inches. It will be apparent to those skilled in the art that the diameter of the edge roller assembly may be varied to meet the demands of particular substrates. By way of example, the diameter of the edge roller assembly could be much larger than 2 inches to facilitate the transporting of a larger substrate, e.g., a flat panel display.

Figure 4A:
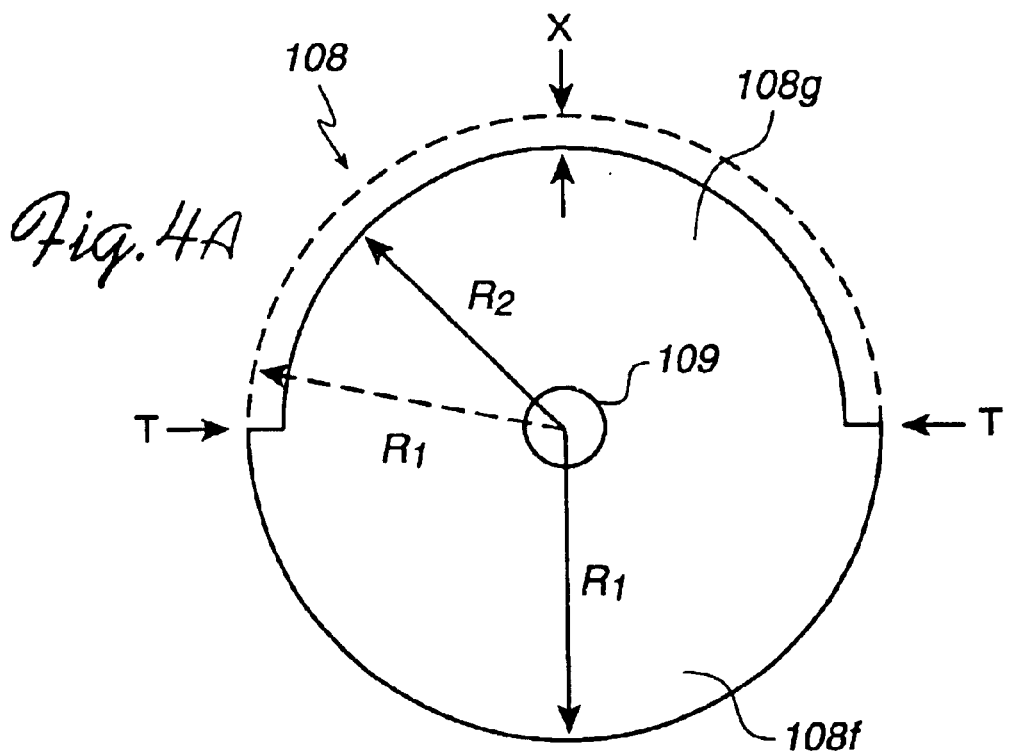
FIG. 4A is a simplified schematic diagram that shows an exemplary configuration of a dual radius wheel in accordance with one embodiment of the invention.

FIG. 4A is a simplified schematic diagram that shows an exemplary configuration of dual radius wheel 108 in accordance with one embodiment of the invention. As shown in FIG. 4A, first semicircular section 108f has radius $R_1$ and second semicircular section 108g has radius $R_2$, which is shorter than radius $R_1$. The difference between radius $R_1$ and radius $R_2$ is a distance, X, that corresponds to a desired clearance for wafer processing, i.e., the distance between the outer surfaces of O-rings 216 and the backside of wafer 214 when second semicircular section 108g faces in an upward direction (see FIG. 3B). The transition between first semicircular section 108f and second semicircular section 108g occurs at points T. In this exemplary configuration, the outer surface of each of first semicircular section 108f and second semicircular section 108g defines an arc that spans about 180 degrees. Consequently, transition points T are spaced around dual radius wheel 108 by about 180 degrees.

Figure 4B:
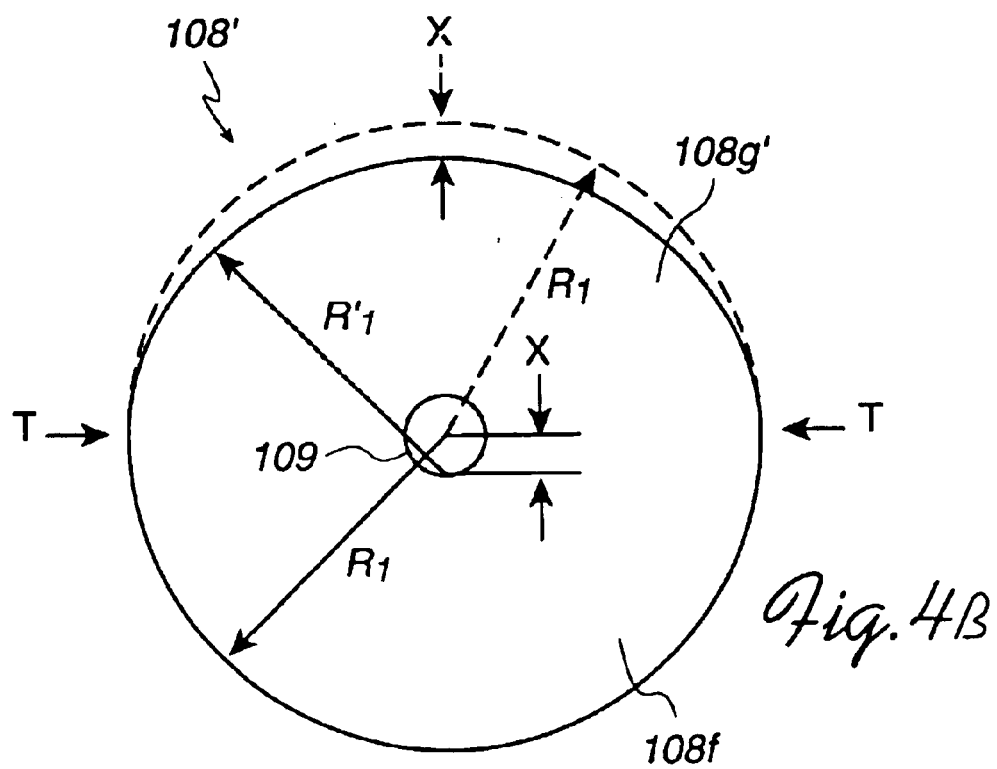
FIG. 4B is a simplified schematic diagram that shows an exemplary configuration of a dual radius wheel in accordance with another embodiment of the invention.

FIG. 4B is a simplified schematic diagram that shows an exemplary configuration of dual radius wheel 108' in accordance with another embodiment of the invention. As shown in FIG. 4B, first semicircular section 108f has radius $R_1$. Second semicircular section 108g has radius $R_1'$, which has the same length as radius $R_1$ but does not originate at the center of dual radius wheel 108. Instead, radius $R_1'$ originates at a point that is offset from the center of dual radius wheel 108 by a distance, X, that corresponds to a desired maximum clearance for wafer processing. When second semicircular section 108g' faces in an upward direction such that points T define a horizontal plane, the clearance provided by dual radius wheel 108' is the same as that provided by dual radius wheel 108 shown in FIG. 4A. In contrast with the constant clearance provided by second semicircular section 108g of dual radius wheel 108, second semicircular section 108g' of dual radius wheel 108' provides a variable clearance. The maximum clearance occurs when second semicircular section 108g' faces in an upward direction such that points T define a horizontal plane. The clearance decreases as dual radius wheel 108' is rotated away from the point of maximum clearance and reaches a minimum at the point at which points T define a vertical plane. Consequently, the transitions at points T between first semicircular section 108f and second semicircular section 108g' of dual radius wheel 108' are smoother than the corresponding transitions in dual radius wheel 108 shown in FIG. 4A.

Figure 5:
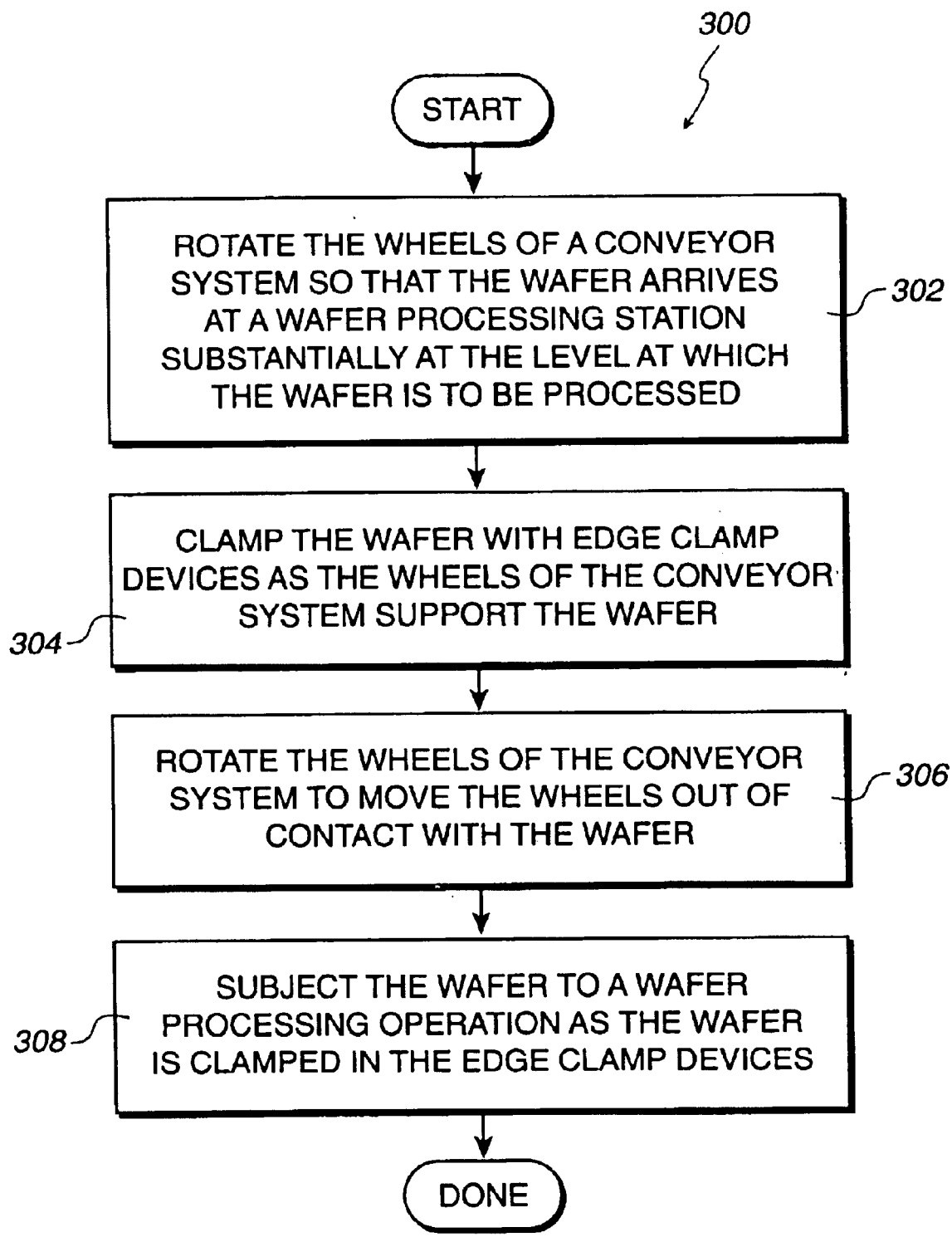
FIG. 5 is a flowchart diagram illustrating the method operations performed in transferring a semiconductor wafer from a conveyor system to a wafer processing station in accordance with one embodiment of the invention.

FIG. 5 is a flowchart diagram 300 illustrating the method operations performed in transferring a semiconductor wafer from a conveyor system to a wafer processing station in accordance with one embodiment of the invention. The method begins in operation 302 in which the wheels of a conveyor system are rotated so that the wafer arrives at a wafer processing station substantially at the level at which the wafer is to be processed in the wafer processing station. By way of example, this may be accomplished by using a conveyor system having a plurality of wheels at least some of which are the dual radius wheels described herein. In one embodiment, a number of the dual radius wheels of the conveyor system are controllably rotated so that the first sections thereof support the wafer as the wafer arrives at the wafer processing station. In one embodiment, the wafer processing station is a brush box and the wafer processing operation is a cleaning operation.

In operation 304, the wafer is clamped with edge clamp devices as the wheels of the conveyor system support the wafer. In one embodiment, the edge clamp devices are disposed on wafer rotation rollers. To facilitate the edge clamping process, it may be desirable to time the rotation of the wheels so that the wafer arrives at the wafer processing station just past the top height of the wheels. When the wheels are timed in this manner, the wafer may be clamped by the edge clamp devices without having the O-rings disposed on the wheels creating skid marks on the backside of the wafer. Once the wafer is edge clamped, the method proceeds to operation 306 in which the wheels of the conveyor system are rotated to move the wheels out of contact with the wafer. In one embodiment, a number of the dual radius wheels of the conveyor system are controllably rotated so that the second sections thereof provide clearance between the dual radius wheels and the wafer. After the wheels have been moved clear of the wafer, in operation 308, the wafer is subjected to a wafer processing operation as the wafer is clamped in the edge clamp devices. Once the wafer processing operation is complete, the method is done.

The wheel, conveyor system, and method described herein are well suited for transporting a wafer in a wafer cleaning system from a first brush box to a second brush box. By way of example, a conveyor system of the invention may be provided in the wafer cleaning system between the first and second brush boxes. At the outset, the wafer may be placed at the process position in the first brush box by robotic handoff to edge clamp devices that clamp the edge of the wafer and hold the wafer during processing. Before the wafer is processed in the first brush box, the wheels of the conveyor system may be controllably rotated to a position at which the wheels clear the wafer. The wafer may then be processed in the first brush box. Once this processing is complete, the wheels of the conveyor system may be controllably rotated to a position at which the wheels support the wafer. The edge clamp devices may then be released so that the wafer rests on the wheels of the conveyor system.

At this point, the wheels of the conveyor system may be rotated to transport the wafer from the first brush box to the second brush box. As the wafer advances along the conveyor system, the wafer is alternately supported by the first and second sections of the dual radius wheels. Consequently, the wafer tilts up and down in a wave-like manner as it advances along the conveyor system. The rotation of the wheels of the conveyor system may be timed so that the wafer is either at or just beyond the peak position of the wafer transport path as the wafer arrives at the second brush box. The wafer may then be edge clamped for processing in the second brush box. Before the wafer is processed in the second brush box, the wheels of the conveyor system may be controllably rotated to a position at which the wheels clear the wafer. To support serial wafer processing at peak efficiency, the action in the second brush box should occur simultaneously with the action in the first brush box.

In summary, the present invention provides an edge roller assembly, a method for contacting an edge of a substrate, and a transport system for transporting semiconductor wafers to a wafer processing station. The invention has been described herein in terms of several exemplary embodiments. Other embodiments of the invention will be apparent to those skilled in the art from consideration of the specification and practice of the invention. For example, the configuration of the lower clamp plate, the upper clamp plate, and the height adjustment knob of the edge roller assembly may be varied from that shown and described herein. In addition, other equivalent fastening techniques may be used to join the lower and upper clamp plates and to mount the height adjustment knob on the upper clamp plate. The embodiments and preferred features described above should be considered exemplary, with the scope of the invention being defined by the appended claims and their equivalents.

What is claimed is:

1. An edge roller assembly, comprising:
   a lower clamp plate;
   an upper clamp plate having a receiving surface, a central throughhole for receiving a drive shaft, a plurality of threaded holes, and a plurality of fingers, the plurality of fingers extending from an upper surface of the upper clamp plate;
   a first grip ring; and
   a second grip ring seated against the receiving surface of the upper clamp plate, the first and second grip rings being disposed between the lower and upper clamp plates in an opposing relationship such that outer surfaces thereof define a groove for receiving an edge of a substrate, and the lower and upper clamp plates being adjustably fastened together so that clamping forces the lower and upper clamp plates exert on the first and second grip rings can be controlled.

2. The edge roller assembly of claim 1, wherein the lower clamp plate is a ring having a surface for receiving the first grip ring and a plurality of holes configured to receive a screw head.

3. The edge roller assembly of claim 1, further comprising:
   a height adjustment knob rotatably disposed on the plurality of fingers extending from the upper surface of the upper clamp plate, the height adjustment knob having a threaded hole formed therein for receiving a threaded portion of the drive shaft.

4. The edge roller assembly of claim 1, wherein the first and second grip rings are O-rings comprised of a rubber material.

5. The edge roller assembly of claim 4, wherein the rubber material has a Shore A hardness in a range from about 40 to about 90.

6. The edge roller assembly of claim 5, wherein the rubber material is selected from the group consisting of VITON rubber, polyurethane rubber, EPDM rubber, and fluoropolymer rubber.

7. The edge roller assembly of claim 3, wherein the lower clamp plate, the upper clamp plate, and the height adjustment knob are comprised of polyethylene terephthalate.

8. A transport system for transporting semiconductor wafers to a wafer processing station, comprising:
a pair of edge roller assemblies disposed in an opposing relationship, each of the pair of edge roller assemblies being disposed on a rotatable drive shaft, and each of the pair of edge roller assemblies including
a lower clamp plate;
an upper clamp plate having a receiving surface, a central throughhole for receiving the rotatable drive shaft, a plurality of threaded holes, and a plurality of fingers, the plurality of fingers extending from an upper surface of the upper clamp plate;
a first grip ring; and
a second grip ring seated against the receiving surface of the upper clamp plate, the first and second grip rings being disposed between the lower and upper clamp plates in an opposing relationship such that outer surfaces thereof define a groove for receiving an edge of a substrate, and the lower and upper clamp plates being adjustably fastened together so that clamping forces the lower and upper clamp plates exert on the first and second grip rings can be controlled.

9. The transport system of claim 8, wherein the lower clamp plate in each of the pair of edge roller assemblies is a ring having a surface for receiving the first grip ring and a plurality of holes configured to receive a screw head.

10. The transport system of claim 8, wherein each of the pair of edge roller assemblies further comprises:
a height adjustment knob rotatably disposed on the plurality of fingers extending from the upper surface of the upper clamp plate, the height adjustment knob having a threaded hole formed therein for receiving a threaded portion of the rotatable drive shaft.

11. The transport system of claim 8, wherein the first and second grip rings in each of the pair of edge roller assemblies are O-rings comprised of a rubber material.

12. The transport system of claim 11, wherein the rubber material has a Shore A hardness in a range from about 40 to about 90.

13. The transport system of claim 12, wherein the rubber material is selected from the group consisting of VITON rubber, polyurethane rubber, EPDM rubber, and fluoropolymer rubber.

14. The transport system of claim 10, wherein the lower clamp plate, the upper clamp plate, and the height adjustment knob in each of the pair of edge roller assemblies are comprised of polyethylene terephthalate.

* * * * *